United States Patent
Kaikuranta et al.

(10) Patent No.: US 7,200,418 B2
(45) Date of Patent: *Apr. 3, 2007

(54) DETECTION OF LIGHTNING

(75) Inventors: Terho Kaikuranta, Piispanristi (FI); Jakke Mäkelä, Turku (FI); Pekka Naula, Piispanristi (FI); Jarmo Heinonen, Salo (FI); Sami Vilhonen, Littoinen (FI); Tom Ahola, Heisinki (FI)

(73) Assignee: Nokia Corporation, Espoo (FI)

( * ) Notice: Subject to any disclaimer, the term of this patent is extended or adjusted under 35 U.S.C. 154(b) by 332 days.

This patent is subject to a terminal disclaimer.

(21) Appl. No.: 10/795,209

(22) Filed: Mar. 4, 2004

(65) Prior Publication Data

US 2005/0197070 A1 Sep. 8, 2005

(51) Int. Cl.
*H04M 1/00* (2006.01)
*H04B 7/00* (2006.01)
*G06F 19/00* (2006.01)
*G01W 1/00* (2006.01)

(52) U.S. Cl. .................. 455/556.1; 455/66.1; 702/4

(58) Field of Classification Search ............ 455/556.1, 455/67.13, 66.1, 114.2, 67.7, 67.11; 340/600, 340/460, 945; 324/72, 76.19, 457; 702/4
See application file for complete search history.

(56) References Cited

U.S. PATENT DOCUMENTS

| | | | |
|---|---|---|---|
| 3,891,919 A | | 6/1975 | Penninger et al. |
| 4,198,599 A | | 4/1980 | Krider et al. |
| 4,272,720 A | | 6/1981 | Lennon |
| 4,543,580 A | | 9/1985 | Bent et al. |
| 4,823,228 A | * | 4/1989 | Bittner ....................... 361/218 |
| 5,263,368 A | * | 11/1993 | Breitmeier et al. ...... 73/170.24 |
| 5,305,210 A | * | 4/1994 | Kuzma et al. ................. 702/4 |
| 5,541,501 A | | 7/1996 | Shaver et al. |
| 5,771,020 A | * | 6/1998 | Markson et al. ............ 342/460 |
| 5,959,815 A | | 9/1999 | Gilbert |
| 5,977,762 A | * | 11/1999 | Murtha et al. ................. 324/72 |

(Continued)

FOREIGN PATENT DOCUMENTS

EP 0186402 7/1986

OTHER PUBLICATIONS

"On the Correlation Between VLF-Atmospherics and Meteorological Data;" H.D. Betz et al.

(Continued)

*Primary Examiner*—Sonny Trinh
(74) *Attorney, Agent, or Firm*—Alfred A. Fressola; Ware, Fressola, Van Der Sluys & Adolphson LLP

(57) ABSTRACT

The invention relates to a mobile radio-frequency enabled device. In order to enable a lightning detection by means of such a device, it comprises an electromagnetic interferences detection component detecting electromagnetic interferences in at least one radio-frequency channel, which at least one radio-frequency channel is usable by the mobile radio-frequency enabled device for a communication link. The device further comprises a processing component adapted to determine whether a lightning stroke can be assumed to have occurred in the vicinity of the mobile radio-frequency enabled device due to an electromagnetic interference detected by said electromagnetic interferences detection component. The invention relates equally to a corresponding system, to a corresponding method and to a corresponding software program product.

33 Claims, 6 Drawing Sheets

U.S. PATENT DOCUMENTS

| | | | |
|---|---|---|---|
| 6,215,294 B1 * | 4/2001 | Coleman | 324/72 |
| 6,246,367 B1 | 6/2001 | Markson et al. | |
| 6,420,862 B2 * | 7/2002 | Medelius et al. | 324/72 |
| 6,552,521 B1 * | 4/2003 | Medelius et al. | 324/72 |
| 6,735,525 B1 * | 5/2004 | Murphy | 702/4 |
| 6,788,043 B2 * | 9/2004 | Murphy et al. | 324/72 |
| 6,791,311 B2 * | 9/2004 | Murphy et al. | 324/72 |
| 6,960,995 B2 * | 11/2005 | Parker et al. | 340/525 |
| 7,016,785 B2 * | 3/2006 | Makela et al. | 702/4 |
| 2001/0048297 A1 | 12/2001 | Medelius et al. | |
| 2004/0257216 A1 * | 12/2004 | Parker et al. | 340/507 |

OTHER PUBLICATIONS

"The ThunderBolt—Storm and Lightning Detector System;" Safety Products Unlimited; http://www.safetyproductsunlimited.com/lightning.html; retrieved from the Internet Nov. 6, 2006.

"StrikeAlert Personal Lightning Detector;" Weather Shop; http://www.weathershop.com/strikealert.html; retrieved from Internet Nov. 6, 2006.

"Space-Weather Sounds—the Mysterious and Beautiful Natural Radio Phenomena of Earth;" S.P. McGreevy's 1996-2006 Natural VLF Radio Phenomena Audio Files; http://www.spaceweathersounds.com/sndbites.html; retrieved from the Internet Nov. 6, 2006.

"Very Low Frequency Group;" VLF Group; http://web.archive.org/web/20000818041622/www-star.stanford.edu/~vlf; retrieved from the Internet Nov. 6, 2006.

"ThunderBolt Applications;" Spectrum Electronics; http://www.spectrumthunderbolt.com/why.html; retrieved from the Internet Nov. 6, 2006.

* cited by examiner

DETECTION OF LIGHTNING

FIELD OF THE INVENTION

The invention relates to a mobile radio-frequency enabled device and to a method of detecting a lightning stroke in such a mobile radio-frequency enabled device. The invention relates equally to a software program product for such a mobile radio-frequency enabled device and to a system comprising such a mobile radio-frequency enabled device.

BACKGROUND OF THE INVENTION

Thunderstorms are a major weather hazard, but are difficult to predict. They can travel at speeds of 20 km/h to 40 km/h, and lightning strokes may occur more than 10 km in front of the rain clouds and equally some distance behind the rain clouds. While a lightning stroke is produced by a cloud or a weather front, many of the most dangerous lightning strokes actually occur when no visible clouds are present above as a warning of a thunderstorm. Thus, a system that warns of possibly harmful thunderstorms, even if only approximately ten minutes before they become visible, can be considered a major safety feature.

There is a large population that would benefit from such a safety feature. To some persons, it might provide only a nice-to-know everyday knowledge. To a considerable number of persons, however, storm and lightning originated threats have significant implications in the form of an increased risk, loss of property or even fatal consequences. A lightning alerting system is of particular interest, for instance, for persons spending much time outdoors, and equally for aviators, navigators or the like. A system providing a warning of lightning even when the weather seems to be perfectly calm and clear may enable a person to take suitable safety measures in time, for instance seek shelter etc.

From the state of the art, many single-purpose lightning detectors are known, but they have some disadvantages from a commercial perspective.

Scientific lightning detectors, which are used in meteorology, are very large and their range is hundreds of kilometers.

Also other high-end lightning detectors using a single radio frequency (RF) band are large and relatively expensive, compared for instance to mobile phones. Moreover, they are usually required to have a specific orientation, for instance standing on a wall or on a desk stand, in order to gain the required accuracy or directionality. They are thus not well suited for a truly mobile use. These devices typically have further to be vertically positioned and held stable for several minutes before a reliable detection of a lightning becomes possible.

In addition, there are now existing rather inexpensive low-end lightning detectors which are completely portable in size and which do not require a specific orientation. These detectors, however, are extremely susceptible to electromagnetic compatibility (EMC) emissions from cars etc. and thus tend to cause spurious alarms especially in an urban setting.

For standard wired phones, it is moreover known from the document U.S. Pat. No. 5,959,815 A1 to detect potentially damaging electrical fields based on a current induced in an extra modem wire.

SUMMARY OF THE INVENTION

It is an object of the invention to provide a reliable lightning detection feature for a mobile RF enabled device.

A mobile radio-frequency enabled device is proposed, which comprises an electromagnetic interferences detection component detecting electromagnetic interferences in at least one radio-frequency channel, which at least one radio-frequency channel is usable by the mobile radio-frequency enabled device for a communication link. The proposed device further comprises a processing component adapted to determine whether a lightning stroke can be assumed to have occurred in the vicinity of the mobile radio-frequency enabled device due to an electromagnetic interference detected by the electromagnetic interferences detection component.

Moreover, a system is proposed, which comprises the proposed device and a network element of a network.

Moreover, a method of detecting the presence of a lightning stroke by means of a mobile radio-frequency enabled device is proposed. The method comprises detecting electromagnetic interferences in at least one radio-frequency channel, which at least one radio-frequency channel is usable by the mobile radio-frequency enabled device for a communication link. The proposed method further comprises determining whether a lightning stroke can be assumed to have occurred in the vicinity of the mobile radio-frequency enabled device due to a detected electromagnetic interference.

Finally, a software program product is proposed, in which a software code for detecting the presence of a lightning stroke is stored. When running in a mobile radio-frequency enabled device, the software code receives information on detected electromagnetic interferences in at least one radio-frequency channel, which at least one radio-frequency channel is usable by the mobile radio-frequency enabled device for a communication link. The software code further determines whether a lightning stroke can be assumed to have occurred in the vicinity of the mobile radio-frequency enabled device based on the received information.

It has to be understood that the radio-frequency channels can be any radio-frequency channels employed in wireless communications. The communication link for which the radio-frequency channels can be used can further be a link for a one-directional or a bi-directional communication. Radio-frequency channels for a one-directional communication may also comprise for example radio-frequency channels used for broadcast signals received by a multitude of mobile radio-frequency enabled devices without transmission capability, such as radio signals or GPS signals.

The invention proceeds from the consideration that a lightning stroke is a single flash which produces besides a visual signal and a partly audible pressure signal as well a brief but strong electromagnetic pulse extending over a wide variety of wavelengths. Typical electromagnetic pulses caused by a lightning stroke cover the frequencies between 10 Hz and 5 GHz, with a peak around 500 kHz. At a normalized distance of 10 km, the amplitudes of such pulses range from 107 mV/m to 1 mV/m in a bandwidth of 1 kHz. The strongest signal of the electromagnetic pulse is the induced electric field caused by the vertical current in the lightning stroke, and this is the parameter that is most commonly measured in large-scale distance-bearing devices. However, due to the complexity of the lightning stroke phenomenon, there are also strong signals in the extremely low frequency (ELF) range of a few hundred Hertz or less, and weaker signals extending up to the Gigahertz range and above. It is a well-known fact that the exact characteristics and time spectra of the electromagnetic interference (EMI) signatures are different in the Megahertz range than in the Kilohertz and the Hertz range due to the slightly different meteorological mechanisms causing them. However, for the purposes of this invention, it is sufficient to note that at all frequencies of interest, a lightning stroke is accompanied by an EMI pulse that can be identified at a distance of many kilometers.

As a result of the EMI pulse, RF channels are briefly interfered during a lightning stroke in the vicinity. The impairment of RF receivers due to an EMI caused by a lightning stroke can be experienced in AM/FM radio, TV or even power supply lines in form of clicks, scratches, loss of sound or picture, noise, etc. Disturbances in RF channels due to a lightning stroke can be sensed at very large distances. Specialized and large-scale lightning detectors are able to detect lightning disturbances, so-called sferics, at a distance of several hundreds of kilometers from a lightning stroke, although these detectors typically operate by measuring the induced electric field rather than interferences in an RF signal as in this invention. Ordinary AM radios are known to suffer from EMI disturbances at distances up to 30 km or more from a lightning stroke, which can even be heard directly in an audio signal as various clicks. At higher frequencies than AM, the signal is typically much weaker due to both atmospheric attenuation and different causation mechanisms, but is nevertheless detectable at large distances.

While in many mobile RF enabled devices electromagnetic interferences in received RF signals are eliminated immediately by filtering, it is proposed in this invention that exactly such electromagnetic interferences in a monitored radio frequency channel are evaluated. If a detected interference seems to be caused by a lightning stroke, a user of the mobile RF enabled device can be alerted. An interference can be assumed to be caused by a lightning stroke for example if it exceeds a predetermined threshold value or if it has a frequency spectrum which is characteristic of a lightning stroke. The lightning detection can be on as long as the RF detection is on.

It is an advantage of the invention that it provides a new security feature that can be implemented in a mobile RF enabled device, for example in a cellular phone. The proposed monitoring of RF channels allows the creation of an integrated system utilizing existing architectures, modules and signaling processing or computing possibilities. Almost no additional components and only minimal changes to the RF part of the device are required. The proposed feature can therefore be implemented with low extra costs and only a small extra size. For example, an implementation might be realized that requires essentially no new hardware components compared to the existing devices, resulting in an added cost of a few Euros versus at least tens of Euros in existing products.

While in many cases, the desire to detect lightning strokes in the vicinity may not be large enough to justify the costs and the difficulty of carrying along a dedicated lightning detector, many people might appreciate a low-cost sensing system that is integrated with a device that they are already carrying along in any case, like a mobile phone or an AM/FM radio. The known art does not provide for such an integration of a lightning detection as a new functionality in other existing portable devices.

For a first aspect of the invention, it is further an aim to enable a cost efficient implementation of the invention.

To this end, the invention is implemented in a device comprising a terminal of a cellular communication system, and the electromagnetic interferences detection component is adapted to detect electromagnetic interferences in at least one silent channel which does currently not contain any traffic.

The first aspect of the invention is based on cellular network operating principles and existing cellular system features that are common to multiple cellular network systems, such as GSM (global system for mobile communications), TDMA (time division multiple access) based systems, CDMA (code division multiple access) based systems, WCDMA (wideband CDMA) based systems or UMTS (universal mobile telecommunications system). In most cellular networks, the control of the air interface (RF) is located on the network side of the communication system, and the terminals only assist in this control, for instance by performing a field strength or BER monitoring of received signals. Thus, the use of the RF channels, including the selection of frequencies, time slots, CDMA codes, transmission power levels, etc., are controlled by the network, and the terminals control their operation according to control commands received from the network. In this way the network can optimize its state according to the respective amount of terminals on field, on the respective data traffic load and on the respective quality of reception at each terminal location. Moreover, the network can optimize the handover of specific terminals from one cell to another, for instance when the terminal is located in a car and changes its geographical location.

For assisting in the control by the network, a terminal of a cellular communication system which is in an idle mode or a traffic mode typically listens to multiple cellular cells and measures the signal strength of signals received by these cells, for example in form of the signal quality and/or the BER. The terminal moreover keeps track of these measurements and reports them to the network. The network control then knows the actual reception quality at a given terminal location on field. For example, a GSM phone reports at specified intervals respective six cells from which signals are received best to the network, but is to be understood that the terminal can listen to more cells. In a typical situation, signals in some channels associated to a few transceiving network elements of the network can be heard with a sufficient quality at a terminal, while some of the other channels are silent as there is no data traffic present. Also, as active connections between a terminal and the network do not last forever, each occupied channel will be released sooner or later. Therefore, there are multiple silent channels available which are known to the terminal and which can be listened to by the terminal. Information on the silent channels can be provided for instance by the network to the terminal.

For the first aspect of the invention, it is therefore proposed that information about silent RF-channels is used to select reception channels which are monitored for the lightning detection. If a terminal listens to such channels which do not contain data traffic, it can detect electromagnetic interferences in a particularly easy way. Normally, these channels should stay practically silent, unless some terminal enters the channel. In this case, however, the channel is removed from a list of silent channels. If a signal having a significant signal strength is received on such a silent channel, this signal therefore indicates an electromagnetic interference which might originate from a nearby lightning stroke. If lightning stroke characteristic signals are detected, an application software or hardware can be informed, for example for notifying a user.

It is an advantage of this first aspect of the invention that it can be realized with low costs, as it uses an existing functionality of cellular systems. An EMI pulse generated by a lightning stroke is long enough to be detected and measured in multiple cellular channels with the sampling rate of the RF system of conventional terminals. The invention can therefore be implemented in existing terminals, even to low costs terminals. No RF-front end or IC (integrated circuit) modifications are needed. At the same time, the normal RF-operation and performance is not influenced.

In one embodiment of the first aspect of the invention, a signal analysis is applied to detected electromagnetic interferences.

Such a signal analysis may be used for example for differentiating electromagnetic interferences caused by a lightning stroke from signals transmitted in said cellular communication system. Any intentional data traffic uses an RF-signal in a format specified by cellular system regulations. Therefore, any other signal type can be interpreted as interference.

A signal analysis evaluating the characteristic signal type may further be used for differentiating electromagnetic interferences caused by a lightning stroke from other types of interferences. To this end, a sophisticated signal analysis module may be employed which identifies a lightning signal signature.

The lightning detection may be active all the time or be activated only when needed.

An activation and deactivation can be performed for instance by a user. If the power consumption of a terminal suffers considerably from an active lightning detection, the lightning detection can be activated by the user only during selected periods of time. For example, a user could activate the lightning detection when he is in a boat overnight.

Alternatively or in addition, an activation and deactivation can be performed automatically by the terminal itself in order to take account of the processing capabilities of the terminal and/or to keep the power consumption as low as possible.

For example, the data processing load in a terminal varies and can reach a maximum level at certain high-load situations. Typically, an active call or video-streaming applications present such a high-load situation, in which there may be no processing capacity left for a lightning detection. Therefore, the lightning detection may be disabled completely during ongoing calls or video-streaming applications, in case the terminal is not capable of handling both simultaneously. In a more sophisticated approach to overcome this problem, the basic detection of electromagnetic interferences is continued even in high-load situations, but detected electromagnetic interferences are only time-tagged and left waiting for further processing until the data processing load decreases.

Moreover, while no indication of a lightning stroke is detected, the sampling rate may be set to a low value in order to maintain a low power consumption in the RF-module of the terminal. Only when the first emerging signs of a lightning are detected, the terminal may increase the sampling rate to an applicable level. Similarly, an EMI detection component can collect EMI pulses during a respective period of time and activate a signal analysis only when a certain threshold level is reached by the number of detected EMI pulses. The processing of the detected EMI pulses can then be carried out at a later point of time at which the load situation improved. This approach allows to optimize the use of an existing processing capacity and the power consumption in a terminal. For example, if ten pulses are detected in a period of 12 minutes, the actual signal analysis can be activated, if there is no ongoing call. If the results of the analysis suggest the presence of an active lightning, an application can be caused to inform the user of the terminal.

The reliability of the lightning detection can be increased by detecting similar lightning originated EMI pulses on several reception channels at the same time. This is possible, since a lightning stroke has wide electromagnetic frequency spectrum. Additionally, a rapid change in reception quality of a cell can also indicate the presence of a lightning as a typical RF-strength variation does not change that fast.

In a further embodiment of the first aspect of the invention, EMI pulses are further detected at the same time in an extremely low frequency band of 30 Hz to 3000 Hz, which overlaps with the audio frequency band, for increasing the reliability of the lightning detection. To this end, an antenna structure, which is connected to an audio signal amplifier, is used as a further input signal route. Alternatively, a microphone circuitry could be employed as an input signal route, if the sensitivity of the microphone circuitry is sufficiently high for an EMI detection. A lightning detection based on these low frequency signals may be realized by an audio signal processing, for example in software. This approach can be made use of as long as no audio input is made, for instance due to a call, and thus most of the time.

Warnings or alerts to a user can be made in accordance with the assumed lightning activity. The amplitude of an EMI pulse at any given frequency depends on the intensity of the lightning stroke and on the distance to the measurement point. If the distance of an assumed lightning is determined, also the approaching speed can be indicated to the user. Further, possible other weather/environmental data can be combined with the proposed lightning detection functionality.

For a second aspect of the invention, it is equally an aim to enable a cost efficient implementation of the invention.

In this case, the invention is implemented in a device comprising a radio apparatus. The radio apparatus includes a chip adapted to process amplitude modulated radio signals received in at least one radio-frequency channel. The EMI detection component is adapted to detect electromagnetic interferences in at least one radio-frequency channel in which amplitude modulated signals are received by monitoring an amplitude modulated radio signal processed and output by the chip.

The second aspect of the invention is based on the idea that the detection of electromagnetic interferences can be carried out outside of the actual AM chip by monitoring the processed AM signal which is output by the chip.

It is an advantage of the second aspect of the invention that existing radio chips can be used without modification. On the whole, a low-cost implementation with few additional components and a low power consumption can be achieved.

The detection of electromagnetic interferences may be realized for instance by a peak detection component and a non-contact sensor, like an inductive sensor.

A lightning stroke will be seen more or less directly as a peak in the AM channel. However, a peak detection component will usually be too slow to detect the initial rise of a peak in any case. A lightning stroke has a rise time of about 0.5 microseconds and a decay time of about 500 microseconds. A non-contact sensor sensitive in the Mhz frequency range may therefore be used to detect quick changes in the amplitude modulated radio signal output by the chip. Such quick changes are indicative of the presence of electromagnetic interferences due to a lightning stroke. In case quick changes in the audio signal are detected, the non-contact sensor may then trigger a detection of a differential peak and the determination of its amplitude in the amplitude modulated radio signal by the peak detection component. This approach moreover allows the power consumption to be kept low.

Optionally, the radio apparatus in addition comprises at least one FM radio channel which is equally monitored with respect to electromagnetic interferences. In this case, the AM and the FM part of the radio apparatus are advantageously operating simultaneously, or at least cycled through very quickly, for instance at millisecond intervals or quicker. A simultaneous detection of electromagnetic interferences in AM and FM channels may then be a precondition for assuming the presence of a lightning stroke.

For additionally monitoring FM radio channels, the radio apparatus includes a chip adapted to process frequency modulated radio signals received in at least one radio-frequency channel. The chip comprises a grounded limiter for limiting the amplitude of received FM radio signals. Electromagnetic interferences in an FM channel are then detected by monitoring the current between the limiter and ground outside of the chip.

Also, possible monitoring FM radio channels can thus be carried out outside of the actual FM chip. The chip for processing FM radio signals may be the same as the chip for processing AM radio signals or a separate chip.

The detection of electromagnetic interferences in an FM channel is less straightforward than in an AM channel, since the frequency modulation aims specifically at reducing such interference by cutting off the amplitude. The amplitude of an EMI pulse caused by a lightning stroke in an FM channel will usually be only about 1% of the amplitude caused in an AM channel. However, any peak will cause a change in the current going from the limiter to ground. Since an EMI pulse caused by a lightning stroke has a very short rise time, as mentioned above, the ground current of the limiter can thus be monitored for quick changes for detecting an electromagnetic interference.

For monitoring the ground current of the limiter, advantageously inductive or other non-contact sensors are used as well, in order to ensure that the path to ground from the limiter is not disturbed considerably.

It has to be noted that in case the AM path comprises a grounded limiter as well, an EMI pulse can also be detected for an AM radio channel in the limiter current.

Advantageously, several AM and FM radio channels are monitored for ensuring a reliable detection of a lightning stroke.

For a third aspect of the invention, it is further an aim to provide an additional feature to a user.

To this end, the proposed device comprises in addition an antenna structure adapted to receive sound signals, for example as part of a microphone, and a thunder detection component adapted to detect sound signals characteristic of an occurrence of thunder in signals received by the antenna structure. The processing component is further adapted to calculate the distance of an assumed lightning by comparing the time of detection of an assumed lightning and the time of detection of signals characteristic of an occurrence of thunder. It has to be noted that the received and evaluated sound signals may also be infrasound signals.

The third aspect of the invention is based on the consideration that many people relax during lightning storms by counting the seconds from the time of a lightning stroke to the thunder, in order to obtain an estimation of the distance to the lightning stroke. It is proposed to leave also the estimation of the distance of a lightning to the mobile radio frequency enabled device. The distance estimation is based on the time lapse between the detection of an assumed lightning stroke and the detection of an assumed occurrence of thunder.

It is an advantage of the third aspect of the invention that an additional feature offered to the user of the device can be realized with very small changes or additions to the hardware, if any.

The occurrence of a lightning stroke is detected by detecting an electromagnetic interference as described above. The detection of the magnitude and of the spectral properties of such an interference might give additional information about the lightning. A stronger interference indicates a stronger lightning, accounting the attenuation caused by the distance. The spectral properties might indicate whether the lightning stroke is to ground or just between clouds. Also the height of such clouds can possibly be determined.

The occurrence of thunder is detected by a sound analysis of signals received via a microphone or some equivalent antenna structure.

In one embodiment of the third aspect of the invention, a multichannel matched filter is first generated based on EMI pulses detected in RF channels. Then, the sound signal is filtered with this matched filter. This allows to correctly associate a series of occurrences of thunder to a series of lightning strokes.

In another embodiment of the third aspect of the invention, the received sound signals are subjected to a multiband envelope detection, in order to differentiate thunder from other sounds. The resulting envelope signals for various frequency bands are then combined. An occurrence of thunder is then assumed in case the output of the combiner exceeds a threshold.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE INVENTION

Figure 1:
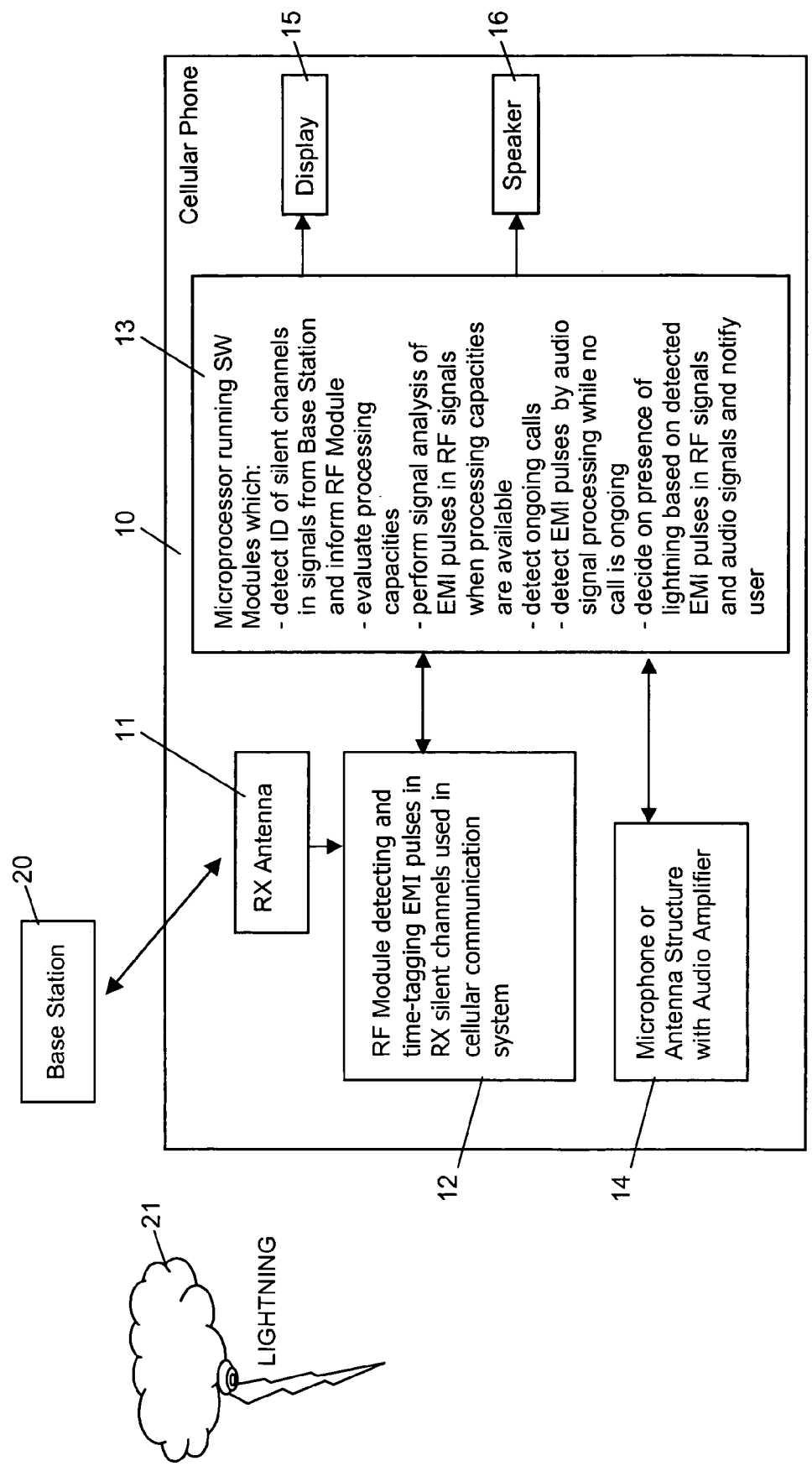
FIG. 1 is a schematic block diagram of a system according to a first embodiment of the invention.

FIG. 1 is a schematic block diagram of a cellular communication system in accordance with a first embodiment of the invention enabling a lightning alert. The system can be for example a GSM system.

The cellular communication system comprises a cellular phone 10 and a base station 20 of a cellular communication network.

The cellular phone 10 comprises a receiving RX antenna 11, which is connected via an RF module 12 to a microprocessor 13. The cellular phone 10 moreover comprises a microphone circuitry 14, which is equally connected to the microprocessor 13. Alternatively to the microphone structure 14, a specific antenna structure connected to an audio amplifier 14 may be employed. The microprocessor 13 is further connected to a display 15 and/or a speaker 16 of the cellular phone 10. In addition, the cellular phone 10 may comprise any other component known to be comprised in conventional cellular phones.

A lightning stroke 21 occurring in the vicinity of the cellular phone 10 is equally indicated.

Figure 2:
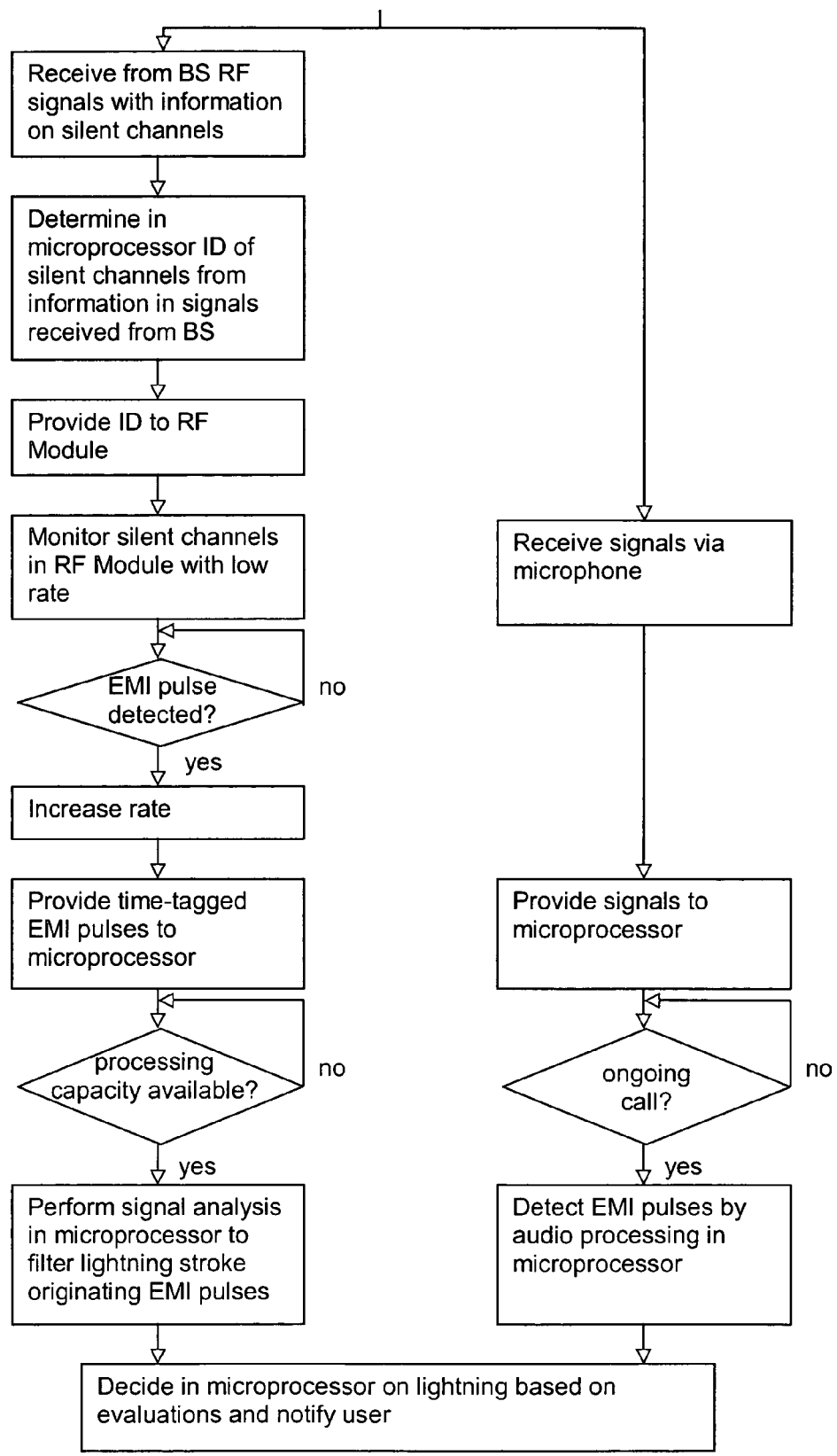
FIG. 2 is a flow chart illustrating the operation in the system of FIG. 1.

The operation of the system of FIG. 1 will now be explained with reference to the flow chart of FIG. 2.

The cellular communication network determines which channels are currently to be used for data traffic in the communication system, each channel being defined for example by a specific frequency, a specific time slot, a specific CDMA code etc. The determination is based in a known manner on measurement data from cellular phones. Usually, there remain various silent channels which are currently not to be used for data traffic, but which can be listened to nevertheless by the cellular phones. The network transmits information about the identity of these silent channels via the base station 20 to the cellular phone 10.

When a lightning detection mode is activated in the cellular phone 10, a silent channel identification software module run by the microprocessor 13 of the cellular phone 10 determines first based on information in signals received from the base station 20 via the RX antenna 11 and the RF module 12 which channels are currently silent channels. The microprocessor 13 provides the identity of the currently silent channels to the RF module 12.

As the silent channels do not contain data traffic, the RF module 12 can monitor the electromagnetic environment via these channels. In a normal situation, basically no signals should be received on the silent channels. If some cellular phone enters the channel, the channel is removed by the network from the list of silent channels. A significant signal received on a silent channel is therefore an indication of an electromagnetic disturbance. Additionally, a rapid change in the reception quality on a channel can also indicate the occurrence of a lightning stroke, since a typical RF-strength variation does not change as fast as an electromagnetic interference caused by a lightning stroke.

At first, the RF module 12 monitors the indicated silent channels with a low sampling rate with regard to EMI pulses having an amplitude above a predetermined threshold. The low sampling rate ensures a low power consumption. Only if an EMI pulse exceeding a predetermined threshold is detected, the sampling rate is increased. The detected EMI pulses are provided along with a respective time tag to the microprocessor 13.

A capacity monitoring software module run by the microprocessor 13 evaluates the current processing capacities of the cellular phone 10. As soon as processing capacities are available, the time tagged EMI pulses provided by the RF module 12 for one or more silent channels are evaluated in more detail by an EMI evaluation software module run by the microprocessor 13. More specifically, the EMI pulses are compared to signal shapes which are employed in the cellular communication system. Moreover, they may be compared in a sophisticated signal analysis with typical lightning pulses, in order to eliminate other possible interference sources. In case the comparison shows that detected EMI pulses can be assumed not to originate from regular signals in the cellular communication signal and in case they correspond moreover to typical pulses resulting from lightning strokes, a lightning is preliminarily assumed to be present in the vicinity of the cellular phone 10.

In addition, the fact is exploited that the electromagnetic pulse produced by a lightning stroke extends over a wide variety of wavelengths. In order to increase the reliability of the lightning detection, EMI pulses in extremely low frequency bands, namely 30–3000 Hz, are detected in addition as long as there is no ongoing call. To this end, signals received via the microphone circuitry 14 or received via a specific antenna structure and amplified by an audio amplifier are forwarded to the microprocessor 13. If there is no ongoing call, an audio signal processing software module run by the microprocessor 13 then detects EMI pulses characteristic of a lightning in the audio signals provided by the microphone circuitry 14 or the special antenna structure.

Lightning is actually considered to be present in the vicinity of the cellular phone 10, in case EMI pulses characteristic of lightning are detected at the same time in several silent channels and, if there is no ongoing call, in addition in audio signals received via the microphone circuitry 14 or the special antenna structure. If such a constellation is met, a decision and notification software module run by the microprocessor 13 informs the user of the cellular phone about the assumed lightning via the display 15 and/or the speaker 16 of the cellular phone 10.

Figure 3:
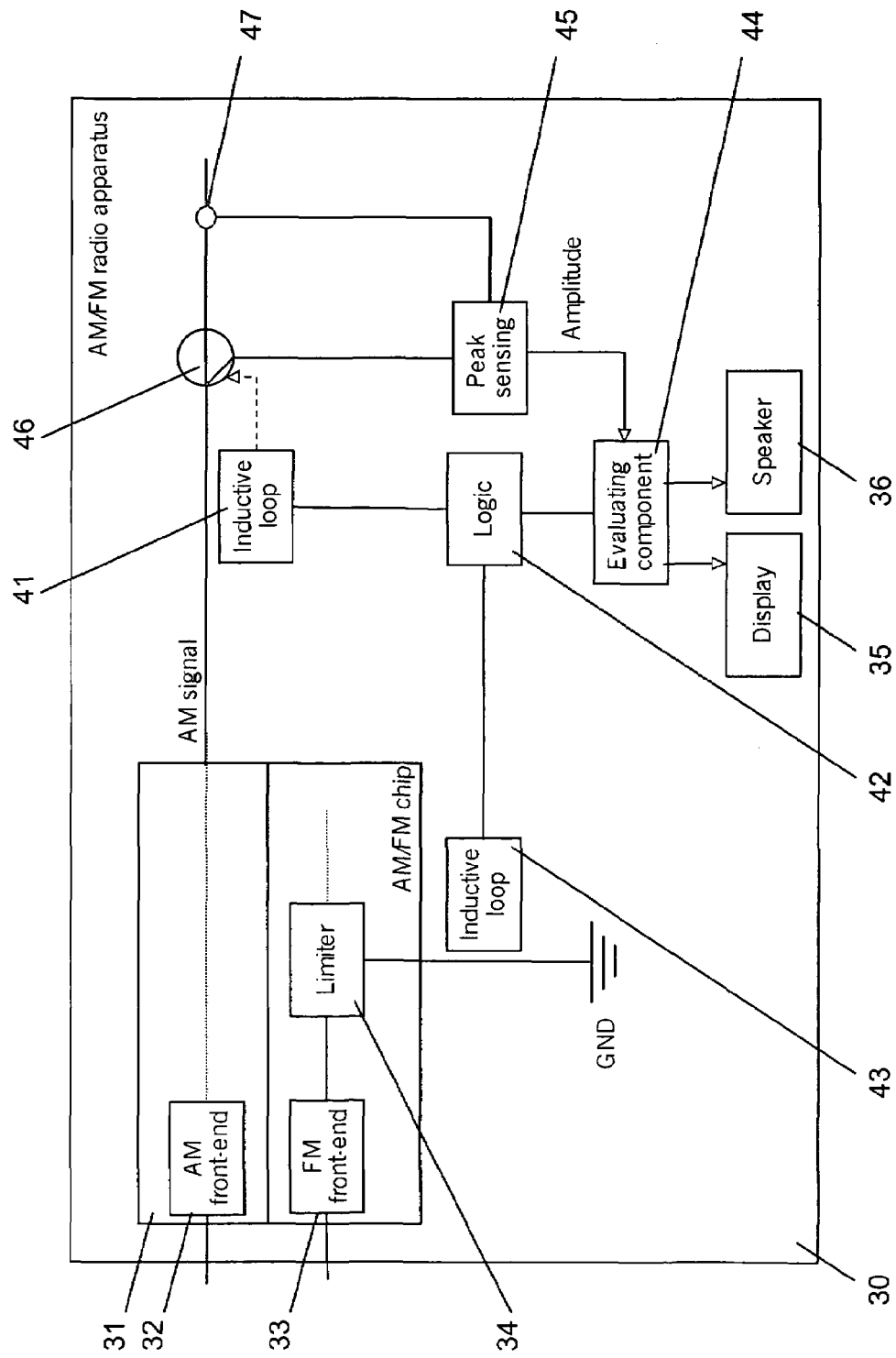
FIG. 3 is a schematic block diagram of an AM/FM radio apparatus according to a second embodiment of the invention.

FIG. 3 is a schematic block diagram of an AM/FM radio apparatus 30 in accordance with a second embodiment of the invention enabling a lightning alert.

The AM/FM radio apparatus 30, which may be implemented in some other device like a cellular phone, comprises at least one AM radio path and at least one FM radio path.

The radio apparatus 30 proceeds from a conventional AM/FM radio apparatus. It comprises a conventional AM/FM chip 31 including an AM front-end 32 and an FM front-end 33, the latter being connected within the chip to an FM limiter 34. The AM signal output by the chip 31 is used for a conventional presentation to a user. The FM signal provided by the FM limiter 34 and output by the chip 31 is equally used for a conventional presentation to a user. The FM limiter 34 is connected in addition to ground GND.

For the second embodiment of the invention, a first inductive loop 41 sensitive in the MHz range is located next to the output of the chip 31 for the AM signal. The first inductive loop 41 is connected to a logic component 42.

A further inductive loop 43 sensitive in the MHz range is located next to the connection between the FM limiter 34 and ground GND. The second inductive loop 43 is equally connected to the logic component 42.

The logic component 42 is further connected to an evaluation component 44.

The radio apparatus 30 comprises in addition a peak sensing component 45 which is connected at two locations to the path of the AM signal output by the chip 31. At the first location, the connection is not fixed but realized by a switching component 46 controlled by the second inductive loop 41. At the second location, a fixed connection 47 of the peak sensing component 45 to the AM signal path is provided. The output of the peak sensing component 45 is equally provided to the evaluation component 44. The evaluation component 44, finally, is connected to a display 35 and/or a speaker 36 of the radio apparatus 30.

The components of the radio apparatus 30 may be realized in hardware or in software run by one or more processing units of the radio apparatus 30.

Figure 4:
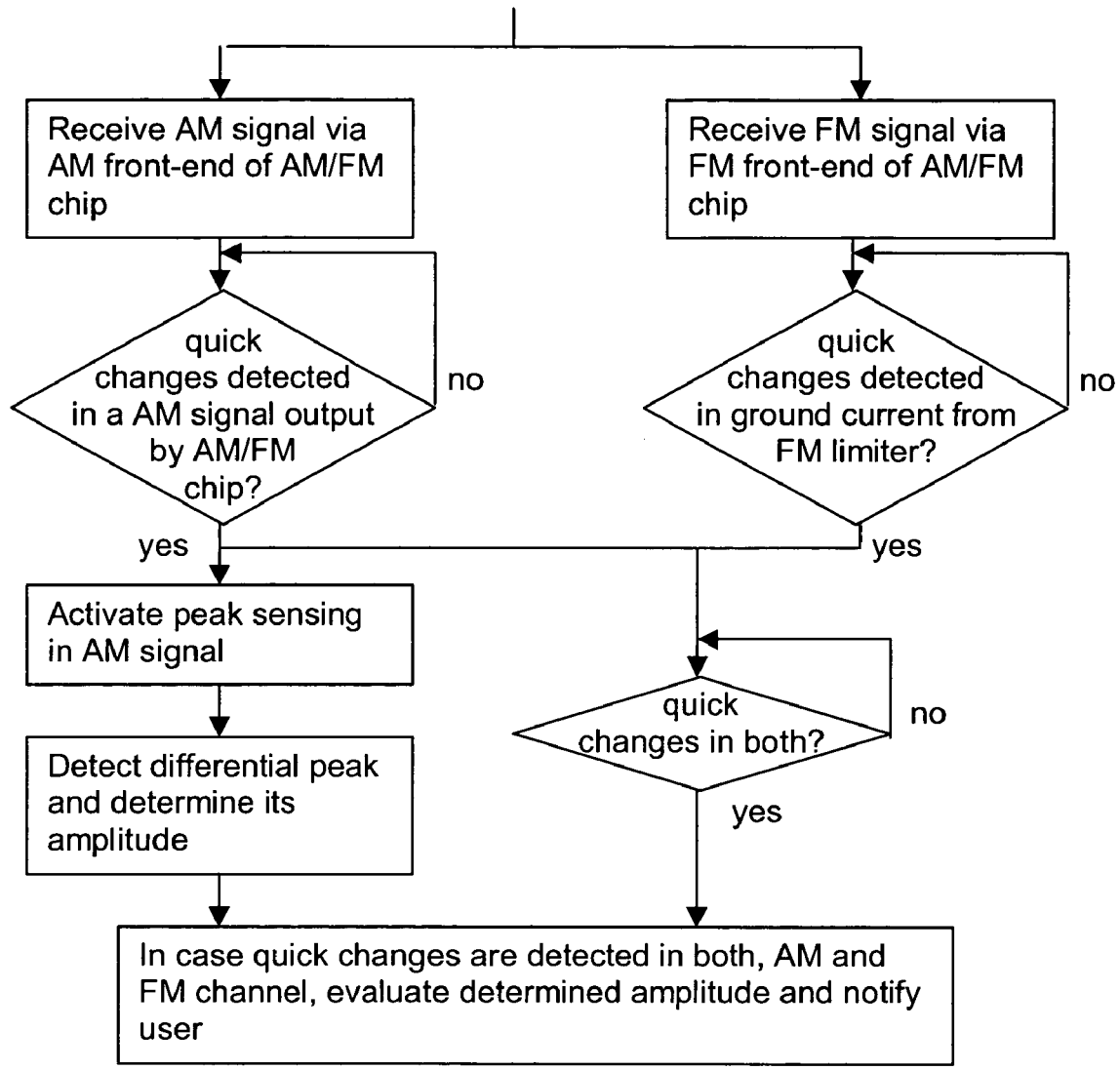
FIG. 4 is a flow chart illustrating the operation in the radio apparatus of FIG. 3.

The operation of the system of FIG. 3 will now be explained with reference to the flow chart of FIG. 4.

The FM radio part and the AM radio part can be and are active simultaneously.

An AM radio signal received via the AM front-end 32 is processed in a conventional manner for presentation, and the resulting AM audio signal is output by the chip 31.

Quick changes in the AM audio signal trigger the first inductive loop 41. That is, if the rate of the changes exceeds a predetermined limit, the first inductive loop 41 provides a corresponding indication to the logic component 42. In addition, the inductive loop 42 controls the switching component 46 to provide a part of the AM audio signal to the peak sensing component 45 in case the rate of the changes exceeds a predetermined limit.

The peak sensing component 45 detects thereupon a possible differential peak identifying a lightning stroke in the AM signal and determines the amplitude of the differential peak. This amplitude is provided to the evaluation component 44.

An FM radio signal received via the FM front-end 33 is processed in a conventional manner for presentation. This processing includes cutting off the amplitude peaks of the received FM signal by the FM limiter 34, in order to reduce possible interferences.

Quick changes in the current on the path between the FM limiter 34 and ground GND trigger the second inductive loop 43. That is, if the rate of the changes exceeds a predetermined limit, the inductive loop 43 provides a corresponding indication to the logic component 42.

If an indication of rapid changes is provided to the logic component 42 at the same time by both, the first inductive loop 41 and the second inductive loop 43, the indication is forwarded to the evaluation component 44.

The evaluation component 44 assumes a lightning stroke to have occurred in the vicinity, if the inductive loops 41, 43 detected a disturbance as well in the AM channel as in the FM channel. The amplitude of the corresponding EMI peak provided by the peak sensing component 45 is then evaluated for determining the strength and/or distance of the lightning.

The evaluating component 44 further provides a warning about the lightning to a user of the radio apparatus 30 via the display 35 and/or the speaker 36, possibly including some information based on the determined amplitude of the differential peak in the AM channel.

The lightning detection is thus implemented completely outside of the actual AM/FM chip 31 or chips by utilizing the ground current for the evaluation of the FM signal and the actual audio signal for the evaluation of the AM signal. The inductive loops 41, 43 ensure that the path to ground from the FM limiter and the AM signal path are not disturbed noticeably.

Figure 5:
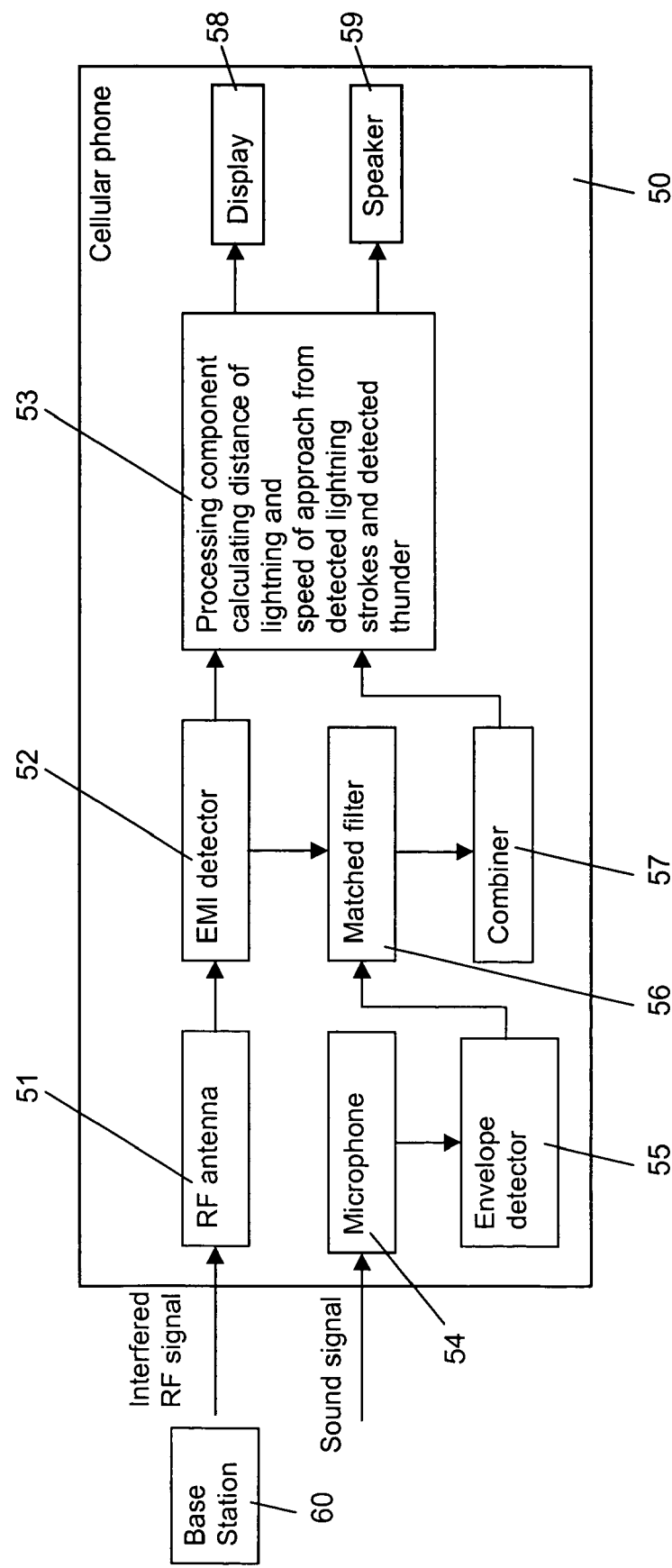
FIG. 5 is a schematic block diagram of a system according to a third embodiment of the invention.

FIG. 5 is a schematic block diagram of a cellular communication system in accordance with a third embodiment of the invention enabling a lightning alert. The system can be for example a GSM system.

The cellular communication system comprises a cellular phone 50 and a base station 60 of a cellular communication network.

The cellular phone 50 comprises an RF antenna 51, which is connected via an EMI detector 52 to a processing component 53. The processing component 53 is realized in hardware and/or software. The cellular phone 50 comprises in addition a microphone 54, which is connected via a multiband envelope detector 55, a multichannel matched filter component 56 and a combiner 57 to the processing component 53. The EMI detector 52 has moreover a controlling access to the matched filter component 56. The processing component 53, finally, is further connected to a display 58 and a speaker 59 of the cellular phone 50.

Figure 6:
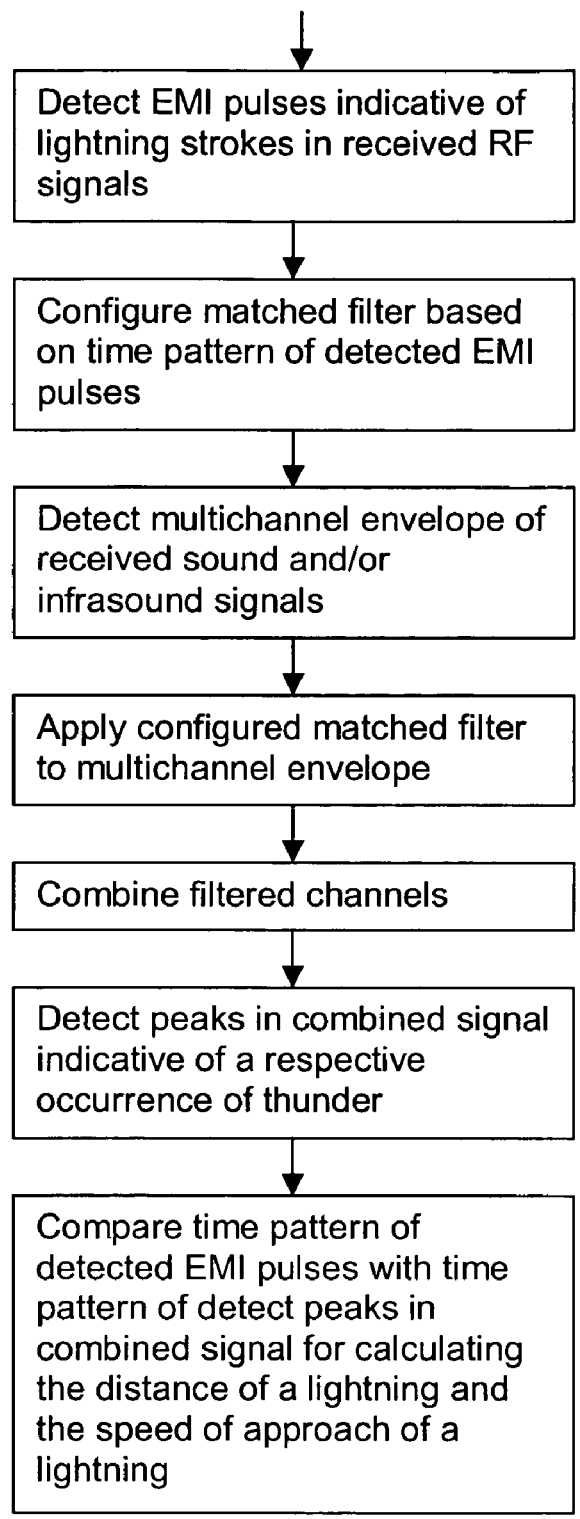
FIG. 6 is a flow chart illustrating the operation in the system of FIG. 5.

The operation of the system of FIG. 5 will now be explained with reference to the flow chart of FIG. 6.

The cellular phone 50 monitors via its RF antenna 51 RF channels which are available in the cellular communication system for the transmission of data.

The EMI detector 52 detects in signals received on the monitored channels EMI pulses indicative of lightning strokes in the vicinity of the cellular phone 50. The EMI pulses are forwarded on the one hand to the processing component 53 for evaluation. In the processing component 53, a timer is started with each detection of a lightning stroke. On the other hand, the time of detection of the EMI pulses is employed for configuring a matched filter employed by the matched filter component 56.

The cellular phone 50 moreover receives via its microphone 54 sound and/or infrasound signals reaching the cellular phone 50, which may originate from a thunder. The fast pressure variation caused by a lightning stroke produces a very wideband sound signal comprising the audible thunder and moreover a very strong infrasound signal, which even travels much farther than the audible signal.

The signals received by the microphone 54 are first subjected to the multiband envelope detector 55. This multiband envelope detector 55 allows to correctly distinguish thunder from a signal contaminated by other sounds, such as rain, wind and sounds generated by humans. The resulting multiband audio envelopes are filtered in the matched filter component 56 with the configured matched filter separately for each channel. The matched filter detects a sequence of occurrences of thunder which fits to the time pattern of a sequence of detected lightning strokes. The filtered channels are then combined by the channel combiner 57 so that sound contamination is suppressed.

The resulting signal is forwarded as well to the processing component 53. When the output of the channel combiner 57 exceeds a threshold value, the timer associated to the lightning stroke which assumably caused the thunder is read. The threshold value is adapted to the ambient noise. The detection is continued for a while to possibly catch even better matches after the first one.

The processing component is now able to calculate the distance of the lightning by comparing the time of detection of a respective lightning stroke with the time of detection of an associated occurrence of thunder. By evaluating the changes in the distance of the lightning based on a sequence of detected lightning strokes and an associated sequence of detected occurrences of thunder, in addition, the speed of approach of the lightning is determined.

The calculated values are presented to a user of the cellular phone via the display 58 and/or the speaker 59.

While there have been shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A mobile radio-frequency enabled device comprising:
an electromagnetic interferences detection component detecting electromagnetic interferences in at least one radio-frequency channel, which at least one radio-frequency channel is usable by said mobile radio-frequency enabled device for a communication link; and
a processing component adapted to determine whether a lightning stroke can be assumed to have occurred in the vicinity of said mobile radio-frequency enabled device due to an electromagnetic interference detected by said electromagnetic interferences detection component.

2. The mobile radio-frequency enabled device according to claim 1, wherein said device comprises a terminal of a cellular communication system, and wherein said electromagnetic interferences detection component is adapted to detect electromagnetic interferences in at least one silent channel which does currently not contain any traffic.

3. The mobile radio-frequency enabled device according to claim 2, wherein said processing component is adapted to receive from a cellular communication network of said cellular communication system information identifying currently silent channels, and wherein said processing component is adapted to inform said electromagnetic interferences detection component about said identified silent channels.

4. The mobile radio-frequency enabled device according to claim 2, wherein said processing component is adapted to perform a signal analysis on electromagnetic interferences detected by said electromagnetic interferences detection component in at least one silent channel for differentiating electromagnetic interferences caused by a lightning stroke at least from one of signals transmitted in said cellular communication system and other types of interferences than electromagnetic interferences due to lightning strokes.

5. The mobile radio-frequency enabled device according to claim 2, wherein said processing component is adapted to adjust the processing load used for determining whether a lightning stroke can be assumed to have occurred in the vicinity of said mobile radio-frequency enabled device to a currently available processing capacity in said device.

6. The mobile radio-frequency enabled device according to claim 2 further comprising an antenna structure adapted to receive sound signals, wherein said electromagnetic interferences detection component is adapted in addition to detect electromagnetic interferences in sound signals received by said antenna structure.

7. The mobile radio-frequency enabled device according to claim 1, wherein said device comprises a radio apparatus including a chip adapted to process amplitude modulated radio signals received in at least one radio-frequency channel, and wherein said electromagnetic interferences detection component is adapted to detect electromagnetic interferences in at least one radio-frequency channel in which amplitude modulated signals are received by monitoring an amplitude modulated radio signal processed and output by said chip.

8. The mobile radio-frequency enabled device according to claim 7, wherein said electromagnetic interferences detection component includes a peak detection component and a non-contact sensor, which non-contact sensor is adapted to detect quick changes in said amplitude modulated radio signal output by said chip and to trigger a detection of the amplitude of peaks in said amplitude modulated radio signal by said peak detection component in case quick changes in said audio signal are detected.

9. The mobile radio-frequency enabled device according to claim 7, wherein said radio apparatus includes a chip adapted to process frequency modulated radio signals received in at least one radio-frequency channel, said chip comprising to this end a limiter for limiting the amplitude of received frequency modulated signals, which limiter is connected to ground, wherein said electromagnetic interferences detection component is adapted to detect electromagnetic interferences in at least one radio-frequency channel in which frequency modulated signals are received outside of said chip by monitoring a current between said limiter and ground.

10. The mobile radio-frequency enabled device according to claim 9, wherein said electromagnetic interferences detection component includes for detecting electromagnetic interferences in at least one radio-frequency channel in which frequency modulated signals are received a non-contact sensor adapted to detect quick changes in said current between said limiter and ground.

11. The mobile radio-frequency enabled device according to claim 1, further comprising an antenna structure adapted to receive sound signals, and a thunder detection component adapted to detect in signals received by said antenna structure sound signals characteristic of an occurrence of thunder, wherein said processing component is further adapted to calculate the distance of an assumed lightning by comparing the time of detection of an assumed lightning and the time of detection of signals characteristic of an occurrence of thunder.

12. The mobile radio-frequency enabled device according to claim 11, wherein said thunder detection component includes a matched filter and wherein said electromagnetic interferences detection component is adapted to configure said matched filter with a time pattern of electromagnetic interferences detected by said electromagnetic interferences detection component.

13. The mobile radio-frequency enabled device according to claim 11, wherein said thunder detection component includes a multiband envelope detection component adapted to detect separately for a plurality of frequency bands an envelope characteristic of an occurrence of thunder in signals received by said antenna structure, and a combiner adapted to combine detected envelopes for said plurality of frequency bands.

14. A system comprising a network element of a network and the mobile radio-frequency enabled device according to claim 1.

15. The system according to claim 14, wherein said mobile radio-frequency enabled device comprises a terminal of a cellular communication system, and wherein said electromagnetic interferences detection component is adapted to detect electromagnetic interferences in at least one silent channel which does currently not contain any traffic.

16. The system according to claim 14, wherein said mobile radio-frequency enabled device comprises a radio apparatus including a chip adapted to process amplitude modulated radio signals received in at least one radio-frequency channel, and wherein said electromagnetic interferences detection component is adapted to detect electromagnetic interferences in at least one radio-frequency channel in which amplitude modulated signals are received by monitoring an amplitude modulated radio signal processed and output by said chip.

17. The system according to claim 14, wherein said mobile radio-frequency enabled device further comprises an antenna structure adapted to receive sound signals, and a thunder detection component adapted to detect in signals received by said antenna structure sound signals characteristic of an occurrence of thunder, and wherein said processing component is further adapted to calculate the distance of an assumed lightning by comparing the time of detection of an assumed lightning and the time of detection of signals characteristic of an occurrence of thunder.

18. A method comprising:
detecting in a mobile radio-frequency enabled device electromagnetic interferences in at least one radio-frequency channel, which at least one radio-frequency channel is usable by said mobile radio-frequency enabled device for a communication link; and
determining whether a lightning stroke can be assumed to have occurred in the vicinity of said mobile radio-frequency enabled device due to a detected electromagnetic interference.

19. The method according to claim 18, wherein said mobile radio-frequency enabled device comprises a terminal of a cellular communication system, and wherein said at least one radio-frequency channel is at least one silent channel which does currently not contain any traffic.

20. The method according to claim 18, wherein said mobile radio-frequency enabled device comprises a radio apparatus including a chip adapted to process amplitude modulated radio signals received in at least one radio-frequency channel, and wherein detecting electromagnetic interferences in at least one radio-frequency channel comprises monitoring an amplitude modulated radio signal, which amplitude modulated radio signal has been received by said radio apparatus in said at least one radio-frequency channel and which received amplitude modulated radio signal has been processed and output by said chip.

21. The method according to claim 18, further comprising
detecting in signals reaching said mobile radio-frequency enabled device sound signals characteristic of an occurrence of thunder; and
calculating the distance of an assumed lightning by comparing the time of detection of an assumed lightning and the time of detection of signals characteristic of an occurrence of thunder.

22. The method according to claim 18, further comprising
receiving information on detected sound signals characteristic of an occurrence of thunder in signals reaching said mobile radio-frequency enabled device; and
calculating the distance of an assumed lightning by comparing the time of detection of an assumed lightning and the time of detection of signals characteristic of an occurrence of thunder.

23. A computer program product having a readable medium in which a software code is stored thereon, said software code realizing the following when executed by a processor running in a mobile radio-frequency enabled device:

receiving information on detected electromagnetic interferences in at least one radio-frequency channel, which at least one radio-frequency channel is usable by said mobile radio-frequency enabled device for a communication link; and
determining whether a lightning stroke can be assumed to have occurred in the vicinity of said mobile radio-frequency enabled device based on said received information.

24. The computer program product according to claim 23, wherein said mobile radio-frequency enabled device comprises a terminal of a cellular communication system, and wherein said at least one radio-frequency channel is at least one silent channel which does currently not contain any traffic.

25. The computer program product according to claim 23, wherein said mobile radio-frequency enabled device comprises a radio apparatus including a chip adapted to process amplitude modulated radio signals received in said at least one radio-frequency channel, and wherein said received information comprises measurements on amplitude modulated radio signals processed and output by said chip.

26. An apparatus comprising a processing component,
said processing component being configured to receive information on detected electromagnetic interferences in at least one radio-frequency channel, which at least one radio-frequency channel is usable by said mobile radio-frequency enabled device for a communication link; and
said processing component being configured to determine whether a lightning stroke can be assumed to have occurred in the vicinity of said mobile radio-frequency enabled device based on said received information.

27. The apparatus according to claim 26, wherein said mobile radio-frequency enabled device comprises a terminal of a cellular communication system, and wherein said at least one radio-frequency channel is at least one silent channel which does currently not contain any traffic.

28. The apparatus according to claim 26, wherein said mobile radio-frequency enabled device comprises a radio apparatus including a chip adapted to process amplitude modulated radio signals received in said at least one radio-frequency channel, and wherein said processing component is configured to received information comprising measurements on amplitude modulated radio signals processed and output by said chip as said information on detected electromagnetic interferences in at least one radio-frequency channel.

29. The apparatus according to claim 26, wherein said processing component is further configured to receive information on detected sound signals characteristic of an occurrence of thunder in signals reaching said mobile radio-frequency enabled device, and to calculate the distance of an assumed lightning by comparing the time of detection of an assumed lightning and the time of detection of signals characteristic of an occurrence of thunder.

30. An apparatus comprising:
means for receiving information on detected electromagnetic interferences in at least one radio-frequency channel, which at least one radio-frequency channel is usable by said mobile radio-frequency enabled device for a communication link; and
means for determining whether a lightning stroke can be assumed to have occurred in the vicinity of said mobile radio-frequency enabled device based on said received information.

31. The apparatus according to claim 30, wherein said mobile radio-frequency enabled device comprises a terminal of a cellular communication system, and wherein said at least one radio-frequency channel is at least one silent channel which does currently not contain any traffic.

32. The apparatus according to claim 30, wherein said mobile radio-frequency enabled device comprises a radio apparatus including a chip adapted to process amplitude modulated radio signals received in said at least one radio-frequency channel, and wherein said means for receiving information on detected electromagnetic interferences in at least one radio-frequency channel are means for receiving information comprising measurements on amplitude modulated radio signals processed and output by said chip.

33. The apparatus according to claim 30, further comprising means for receiving information on detected sound signals characteristic of an occurrence of thunder in signals reaching said mobile radio-frequency enabled device; and means for calculating the distance of an assumed lightning by comparing the time of detection of an assumed lightning and the time of detection of signals characteristic of an occurrence of thunder.

* * * * *